(12) United States Patent
Morgan

(10) Patent No.: US 10,530,321 B2
(45) Date of Patent: Jan. 7, 2020

(54) DEEP REJECTION REFLECTIONLESS FILTERS

(71) Applicant: Associated Universities, Inc., Washington, DC (US)

(72) Inventor: Matthew A. Morgan, Earlysville, VA (US)

(73) Assignee: Associated Universities, Inc., Washington, DC (US)

( * ) Notice: Subject to any disclaimer, the term of this patent is extended or adjusted under 35 U.S.C. 154(b) by 0 days.

(21) Appl. No.: 16/372,626

(22) Filed: Apr. 2, 2019

(65) Prior Publication Data

US 2019/0229696 A1 Jul. 25, 2019

Related U.S. Application Data

(63) Continuation-in-part of application No. 15/811,850, filed on Nov. 14, 2017, now Pat. No. 10,374,577, which is a continuation-in-part of application No. 15/298,459, filed on Oct. 20, 2016, now Pat. No. 10,263,592.

(60) Provisional application No. 62/248,768, filed on Oct. 30, 2015, provisional application No. 62/290,270, filed on Feb. 2, 2016, provisional application No. 62/372,974, filed on Aug. 10, 2016, provisional application No. 62/652,731, filed on Apr. 4, 2018, provisional application No. 62/775,512, filed on Dec. 5, 2018.

(51) Int. Cl.
*H03H 7/06* (2006.01)
*H03H 7/38* (2006.01)
*H03H 7/01* (2006.01)
*H03H 7/065* (2006.01)

(52) U.S. Cl.
CPC .......... *H03H 7/065* (2013.01); *H03H 7/0115* (2013.01); *H03H 7/0138* (2013.01); *H03H 7/06* (2013.01); *H03H 7/38* (2013.01)

(58) Field of Classification Search
CPC .......... H03H 7/38; H03H 7/0115; H03H 7/06; H03H 7/065
USPC ........................................ 333/32, 168, 175
See application file for complete search history.

(56) References Cited

U.S. PATENT DOCUMENTS

| | | | |
|---|---|---|---|
| 3,514,722 A | 5/1970 | Cappucci et al. | |
| 3,605,044 A | 9/1971 | Seidel et al. | |

(Continued)

FOREIGN PATENT DOCUMENTS

CA  2629035  9/2009

OTHER PUBLICATIONS

Taiwanese Office Action dated Mar. 9, 2018.
(Continued)

*Primary Examiner* — Rakesh B Patel
(74) *Attorney, Agent, or Firm* — Remenick PLLC

(57) ABSTRACT

Reflectionless electronic filters, as well as a method for designing such filters is disclosed, along with a method of realizing critical subcircuits within those filters that mimic the behavior of tee- and pi-networks having negative elements, though the critical subcircuits themselves are entirely passive. This allows a much broader range of transmission responses to be realized in reflectionless form than in the prior art, and especially with lower ripple factor for deeper rejection in equal-ripple Chebyshev responses. Reflectionless filters preferably function by absorbing the stop-band portion of the spectrum rather than reflecting it back to the source, which has significant advantages in many different applications.

15 Claims, 6 Drawing Sheets

(56) References Cited

U.S. PATENT DOCUMENTS

| | | | |
|---|---|---|---|
| 3,748,601 | A | 7/1973 | Seidel |
| 3,869,585 | A | 3/1975 | Snyder |
| 4,123,732 | A | 10/1978 | Daniel |
| 4,287,391 | A | 9/1981 | Queen |
| 5,319,329 | A | 6/1994 | Shiau et al. |
| 5,345,375 | A | 9/1994 | Mohan |
| 5,982,142 | A | 11/1999 | Sullivan et al. |
| 6,122,533 | A | 9/2000 | Zhang et al. |
| 7,232,955 | B1 | 6/2007 | Shadel et al. |
| 2002/0024392 | A1 | 2/2002 | Maruyama et al. |
| 2007/0152750 | A1 | 7/2007 | Andersen et al. |
| 2008/0297284 | A1 | 12/2008 | Ishii et al. |
| 2010/0205233 | A1 | 8/2010 | Morgan |
| 2012/0023059 | A1 | 1/2012 | Morgan et al. |
| 2013/0257561 | A1 | 10/2013 | Gorostegui |
| 2016/0126606 | A1 | 5/2016 | Morgan |

OTHER PUBLICATIONS

Morgan, M. et al. Reflectionless Filter Structures. Jul. 29, 2014.
Morgan, M. Enhancement of Reflectionless Filters Using Stop-Band Sub-Networks. Jul. 2014.
PCT Search Report and Written Opinion for PCT/US16/057829 dated Feb. 23, 2017.

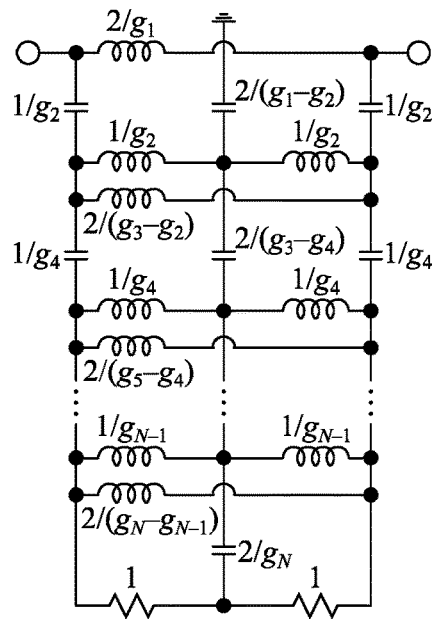
Figure 1A- Prior Art
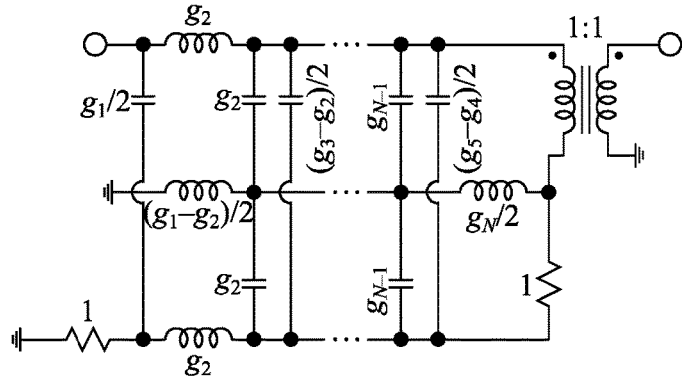
Figure 1B - Prior Art
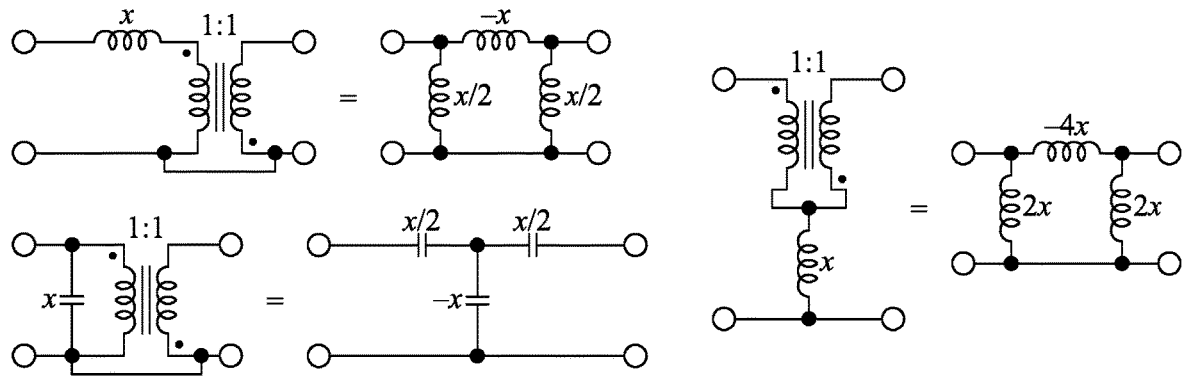
Figure 2
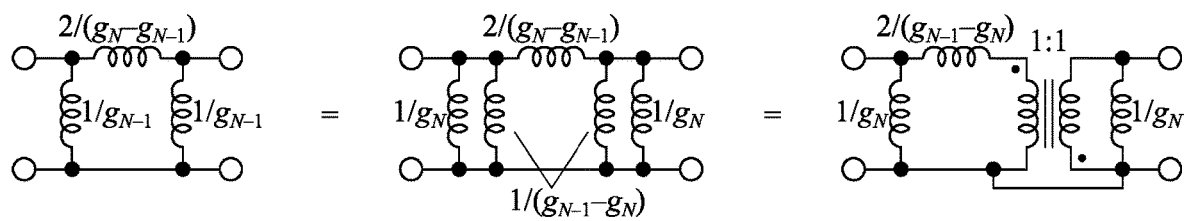
Figure 3

DEEP REJECTION REFLECTIONLESS FILTERS

REFERENCE TO RELATED APPLICATIONS

This application is a Continuation-In-Part of U.S. Non-Provisional application Ser. No. 15/811,850, filed Nov. 15, 2017, entitled "Optimal Response Reflectionless Filters," which is a Continuation-In-Part of U.S. Non-Provisional application Ser. No. 15/298,459, filed Oct. 20, 2016, entitled "Optimal Response Reflectionless Filters," which claims priority to U.S. Provisional Application Nos. 62/248,768, filed Oct. 30, 2015, 62/290,270, filed Feb. 2, 2016, and 62/372,974, filed Aug. 10, 2016, all entitled "Optimal Response Reflectionless Filters." This application also claims priority to US Provisional Application Nos. 62/652,731, filed Apr. 4, 2018, and 62/775,512, filed Dec. 5, 2018, both entitled "Deep Rejection Reflectionless Filters," All are hereby specifically and entirely incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field

The invention is directed toward electronic filters and methods of their use. Specifically, the invention is directed toward reflectionless electronic filters and methods of their use.

2. Background

Virtually all electronic systems use some kind of filtering to reject unwanted frequency components. In most conventional filters, the rejected signals are bounced back to the source, eventually dissipating in the generator itself, or in the interconnecting wires/transmission lines, or being radiated into the instrument housing. This manner of rejecting unwanted signals can sometimes lead to harmful interactions with other components in the system, either by spurious mixing in non-linear devices, unintentional re-biasing of sensitive active components, or cross-talk between various signal paths. A solution was sought for a filter that would absorb these unwanted signals before they could compromise performance. This led to a novel absorptive filter topology which was patented in 2013 (U.S. Pat. No. 8,392,495), improved and expanded with additional patents in 2017 and 2018 (U.S. Pat. Nos. 9,705,467 and 9,923,540), and additional non-provisional applications (U.S. App. Pub. Nos. 2017/0126195, 2017/0331446, and 2018/0083601) the entirety of which are incorporated by reference herein. FIGS. 1A and 1B depict two examples of reflectionless low-pass filters known in the prior art. The reflectionless filter solved many problems encountered with conventional filters, such as the sensitivity of mixers to poor out-of-band terminations, detrimental and difficult-to-predict non-linear effects from reactive harmonic loading, leakage or cross-talk due to trapped energy between the filter and other poorly matched components, and numerous other problems associated with out-of-band impedance matching. It also realized superior performance and manufacturability when compared to other approaches to absorptive filters, such as terminated diplexers and directional filter structures employing quadrature hybrids.

Despite these benefits, however, the more sophisticated versions of the reflectionless filter topologies which could realize classically optimal filter responses such as Chebyshev type I and type II were limited in the ripple factor that could be achieved, for ripple factors below a certain threshold in these topologies required elements with negative values, which are non-passive. One solution was to synthesize these negative elements using active feedback circuits (as taught in U.S. App. Pub. No. 2018/0083601). It is desirable to remove the limitation on ripple factor to allow more classical filter responses to be achieved (such as Butterworth), without having to introduce active elements, all while maintaining the benefits of the original reflectionless filter topology.

SUMMARY

The present invention addresses several of the problems and disadvantages associated with conventional filters, and with the prior art of reflectionless filters, thereby providing a new resource for band selection and definition in electronic systems. An alternative topology which uses transformers in concert with other passive elements to manifest the same behavior as groups of elements in the original topology that contained the negative elements has been surprisingly discovered.

The elements in FIGS. 1A, 1B, and all other figures in this document are labeled with normalized element values. For example, if a capacitor is labeled "x", then its non-normalized value would be given by $$C = x\frac{Y_0}{\omega_c}$$

and if an inductor is labelled "x", then its non-normalized value would be given by $$L = x\frac{Z_0}{\omega_c}$$

where $Z_0$ is the system characteristic impedance, $Y_0=1/Z_0$ is the system characteristic admittance, and $\omega_c$ is the filter's angular cutoff frequency in radians per second. Finally, resistors labeled with the normalized value "x" would have non-normalized value $$R=xZ_0$$

As FIG. 1A is an electrically symmetric circuit—meaning it has the same electrical behavior forward and backwards—it may be analyzed using a well-known technique to those skilled in the art called even-/odd-mode analysis. In summary, the circuit is characterized by testing its response to two theoretical inputs: an even-mode, where the two ports are stimulated with identical signals in-phase, and an odd-mode where the two ports are stimulated with identical signals 180 degrees out-of-phase. The response of the filter to each of these inputs may be likened to that of an equivalent single-port circuit known as the even- and odd-mode equivalent circuits, respectively. As taught in the prior art (e.g. U.S. Pat. No. 8,392,495), the response of the complete filter may then be found as the superposition of the responses of the even- and odd-mode equivalent circuits. Most importantly, the filter is found to be reflectionless (to have zero reflection coefficient at either port and at any frequency) if and only if the even- and odd-mode equivalent circuits are duals—that is, the normalized input impedance of the even-mode equivalent circuit is equal to the normalized input admittance of the odd-mode equivalent circuit, or equivalently that the normalized input admittance of the even-mode equivalent circuit is equal to the normalized input impedance of the odd-mode equivalent circuit.

The prototype parameter values ($g_k$, for k=1 to N, where N is the filter order) of the given topologies in FIGS. 1A and 1B may be chosen arbitrarily to realize different responses. Formulas for the values for certain canonical responses, e.g. Chebyshev, are well-documented and the results tabulated in many textbooks. However one selects them, one must ensure that the values, $g_k$, for odd k must be greater than the adjacent values, $g_k$, for even k. In the case of a Chebyshev response, this is ensured if the ripple factor (a parameter defining the size of the ripples in the pass-band for type I and in the stop-band for type II) is larger than a certain threshold (given in U.S. App. Pub. Nos. 2017/0126195 and 2018/0083601). For smaller ripple factors, or for any selection of $g_k$ values which violates this condition, some of the elements shown will take on negative values—for example, the top-middle capacitor in FIG. 1A, which is labeled "$1/(g_1-g_2)$," or the bottom-most inductor labeled "$2/(g_N-g_{N-1})$" where N is odd.

The present invention removes this limitation by recognizing that the negative elements always appear in groups with other, positive elements that render them passive as a whole, and thus can be replaced with equivalent circuits that incorporate no negative elements while having the same behavior. Three examples are shown in FIG. 2. Note that the transformers have unity turns-ratio, but are wired to invert the current in one coil with respect to the other (note the use of the well-established dot convention). In the present invention, element groupings such as these which have passive-only elements but which equate in their behavior to equivalent circuits having negative elements will be called "critical subcircuits." There are other, similar circuits which may accomplish this, all of which are to be incorporated into the present invention. For example, the critical subcircuit may contain more than just the one passive element besides the transformer as needed to fine-tune the response. It may be any compound immittance (formed with multiple lumped elements) in series or in parallel with the coils of the transformer, and the transformer itself may have different turns ratio or orientation with respect to the rest of the circuit.

Note that the transformer on the output port of FIG. 1B is not part of a critical subcircuit, because it does not combine with the other elements in any way that achieves equivalence with a counterpart grouping have negative elements—the transformer in this case is acting merely as a balun, converting the port connection from differential to single-ended.

It is important to note that while the equivalent tee- or pi-networks shown in FIG. 2 are topologically symmetric, the same isn't necessarily true of the critical subcircuits that equate to them (though they could be redrawn to appear symmetric). Whether drawn with topological symmetry or not, they are still electrically symmetric, since their behavior is the same from both sides, and the above-mentioned principles of even-/odd-mode analysis still apply.

The use of critical subcircuits in the present invention is best illustrated by applying them to the topology in FIG. 1A. First, let us focus on the trio of inductors at the bottom, and assume $g_N<g_{N-1}$. Using the first equivalent circuit from FIG. 2, we may transform this grouping into a critical subcircuit as shown in FIG. 3. Note that the remaining elements, especially $2/(g_{N-1}-g_N)$, are positive. Substituting this back into the original topology, we have the new filter shown in FIG. 4.

If we further assume that $g_1<g_2$ (which need not always be the case) then we still have a negative capacitor in the top-middle of the topology, labeled "$2/(g_1-g_2)$." This negative element takes a bit more effort to remove, since it is not directly connected to any elements which easily passify it. The topology may be altered to do so, however, by recognizing that entirety of the filter below these capacitors has no connection to ground. Thus, the currents flowing through the capacitors $1/g_2$ have nowhere to sink except through the negative capacitor between them, as illustrated in FIG. 5. We may therefore add coupling transformers as shown so as to enforce this condition, in preparation for the next step where the outer capacitors will be moved into the interior of the filter. This movement is shown in FIG. 6 where we have simply transferred each outer capacitor from one side of the adjoining transformer to the other. If the transformers did not have unit turns-ratio, the value of the capacitors would also change (for the purposes of this example, however, we will leave them fixed). Note that after this step, we have in the middle of the filter a tee-network of capacitors where the central one is negative. This may therefore be exchanged for a critical subcircuit having only positive elements but equivalent electrical behavior, as shown.

At this point, the filter may be considered a complete example of the present invention where two element groups with negative elements have been removed in favor of critical subcircuits that mimic them. However, there are some variations that are useful in some embodiments. In FIG. 7A, we have once again moved the series capacitors back out of the interior circuit (now having value $1/g_1$ instead of $1/g_2$). The benefit of this variation is that it further isolates the transformers from the pass-band of the circuit, easing the bandwidth over which the transformers have to perform well (real transformers in practice, unlike the ideal transformers shown here, have limited useful bandwidth). Another variation has the coupling transformer coils rotated 90 degrees, as shown in FIG. 7B. In the ideal case used for the development sequence here, this rotation has no effect, but again in practice real transformers have difficulty operating at DC. The modified orientation helps to block DC currents from reaching the lower parts of the circuit, which may be desirable for low-pass filters. As with any lumped-element circuit, of course, the entire filter of the present invention may be transformed using well-known element-by-element substitutions to create from these examples high-pass, band-pass, or band-stop filters, as needed.

One may also recognize that the grouping of three transformers near the top of the circuits in FIGS. 7A and 7B are redundant to one another, as they all simply mirror currents from certain branches of the circuit to others. The same effect can be achieved with a single transformer, as shown in FIG. 8.

The transformer in a critical subcircuit may have leakage inductance or other parasitics which can be absorbed into the adjacent elements of the filter. This could potentially allow the use of coupled coils having finite coil inductance instead of real transformers, or transformer implementations (such as planar) which have relatively low coupling factor. In fact, the term "transformer" shall be understood to include both transformers and coupled coils in this document.

As many critical subcircuits as are needed to realize the filter without any negative elements may be included. A Butterworth low-pass filter of seventh-order is shown in FIG. 9 as an example, utilizing four critical subcircuits, encircled in dashed lines.

This invention does not limit the user to a particular filter response, but is capable of realizing many canonical responses (e.g. Butterworth, Chebyshev, Zolotarev, or Legendre) of both even- and odd-order, depending on the selection of the normalized element values, $g_k$. (in the even-order case, the final normalized element value, $g_N$, may approach either zero or infinity). These responses in turn have some free parameters, such as the amplitude of the ripples, known as ripple factor. It is known that certain ripple factors, say for Chebyshev filters, yield element values such that adjacent differences, e.g. $1/(g_k-g_{k\pm1})$, are identically zero or infinity. In these instances, one or more elements may be eliminated from the filter entirely, simplifying the filter. For a seventh-order Chebyshev filter, for example, this occurs for ripple factors of 0.2187, 0.01891, and so on.

DESCRIPTION OF THE DRAWINGS

The invention is described in greater detail by way of example only and with reference to the attached drawings, in which:

FIGS. 1A and 1B show reflectionless filters known in the prior art. FIG. 1A depicts a topology capable of realizing Chebyshev type II filters, among others. FIG. 1B depicts a topology capable of realizing Chebyshev type I filters, among others. Both are labeled with normalized element values, and both are low-pass filters for the purpose of illustration, but could be converted to high-pass, band-pass, or band-stop using transformations that are well known in the field.

FIG. 2 shows circuits incorporating transformers and passive elements which have behavior equivalent to the pi- and tee-networks shown with one negative element each.

FIG. 3 illustrates the transformation of a pi-network of inductors where one is negative ($g_N<g_{N-1}$) into a critical subcircuit having only positive elements.

FIG. 7A depicts series capacitors moved back to the outer parts of the filter. FIG. 7B depicts the orientation of coupling capacitors rotated to block DC currents in the stop-band. Two of the coupling transformers are labeled and the critical subcircuits are encircled with dashed lines.

DETAILED DESCRIPTION

As embodied and broadly described herein, the disclosures herein provide detailed embodiments of the invention. However, the disclosed embodiments are merely exemplary of the invention that can be embodied in various and alternative forms. Therefore, there is no intent that specific structural and functional details should be limiting, but rather the intention is that they provide a basis for the claims and as a representative basis for teaching one skilled in the art to variously employ the present invention.

A problem in the art capable of being solved by the embodiments of the present invention is a circuit topology and design technique for electronic filters that are well-matched at all frequencies. It has been surprisingly discovered that such filters have a number of unexpected advantages, including minimal reflections on their input and output ports, either in their pass bands or stop bands, or the transition bands. The return loss for these filters is substantially infinite (in decibels) at all frequencies. In conventional filters, on the other hand, stop band rejection is achieved by reflecting the unwanted portion of the spectrum back toward the signal source rather than absorbing it. The instant filters are comprised of lumped element resistors, inductors, capacitors, and transformers, and can be implemented in whatever form is suited to the application (e.g. wire-leaded, surface-mount, monolithically-integrated, or with active, synthetic equivalent circuits).

Figure 4:
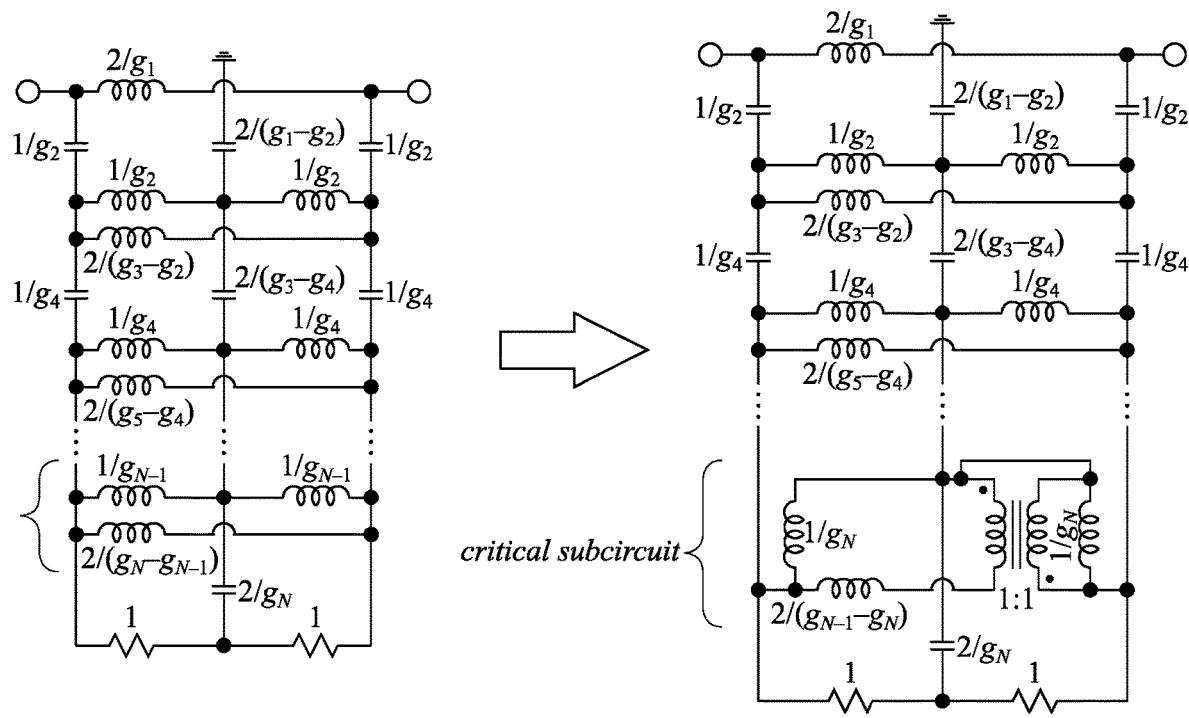
FIG. 4 shows the development of a new filter topology in the present invention which has a critical subcircuit equivalent to a grouping in the original topology wherein one element was negative.
Figure 5:
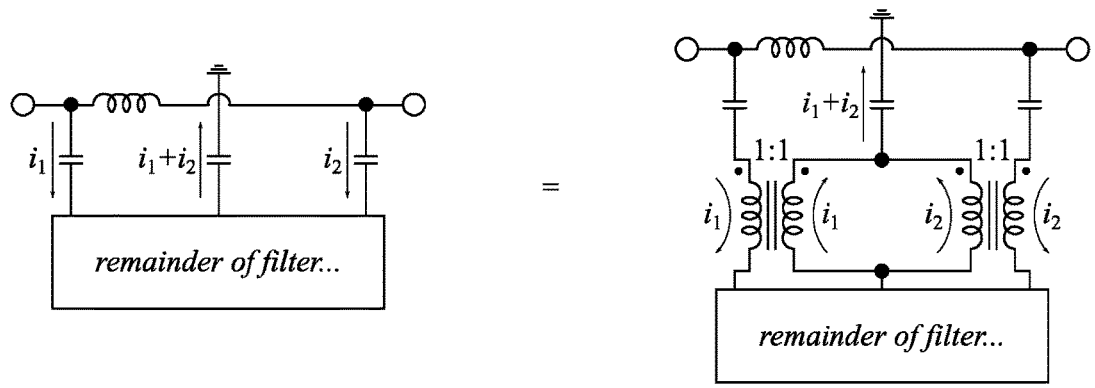
FIG. 5 illustrates the first step in modifying the original filter topology so that a negative capacitor may be replaced with a critical subcircuit. In this step, coupling transformers are added to hold the current summation constraint before the outer capacitors are moved into the interior.
Figure 6:
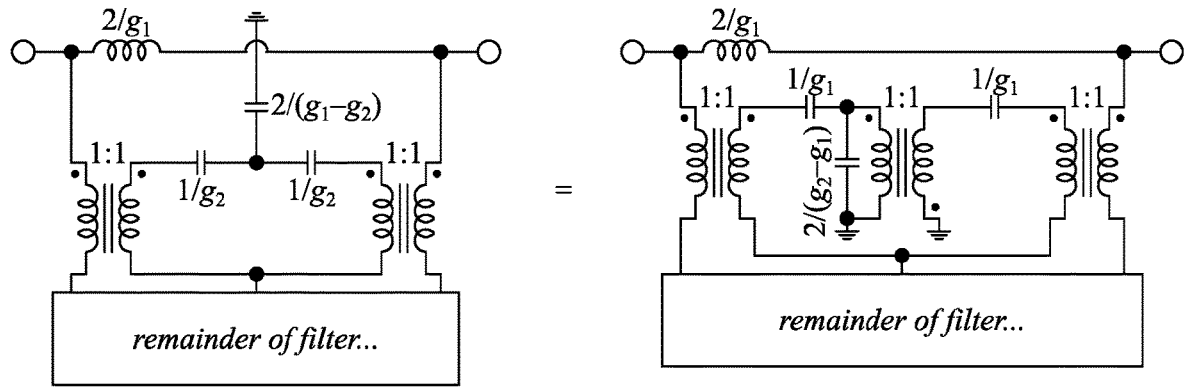
FIG. 6 illustrates the second step in modifying the original topology. The outer capacitors are moved into the interior, so that the resulting capacitor group can be replaced with an equivalent critical subcircuit, as shown.
Figures 7A, 7B:
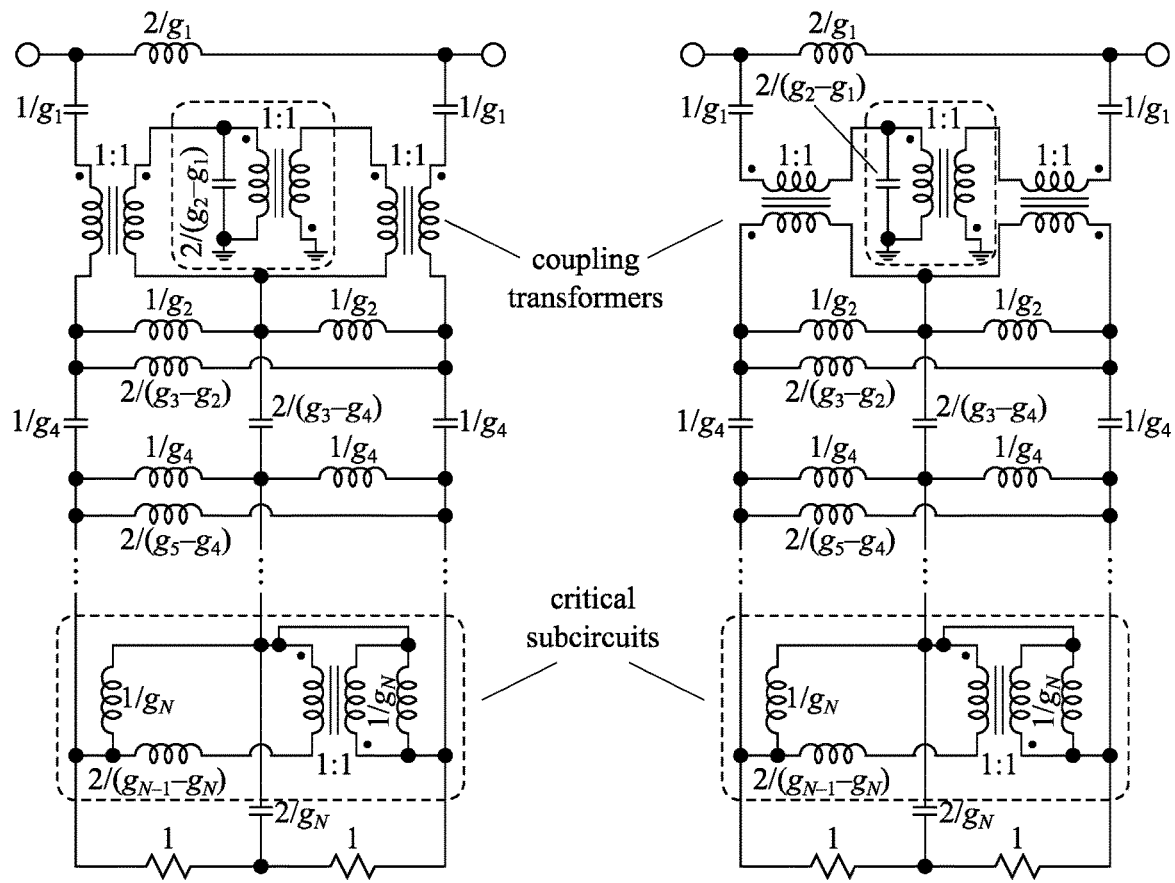
FIGS. 7A and 7B show two examples of a reflectionless filter in the present invention wherein two negative elements are removed in favor of critical subcircuits which mimic their behavior.

FIG. 7A shows one possible embodiment of a reflectionless filter of the present invention. Although not drawn topologically symmetric, it is electrically symmetric in that it has the same port parameters from both sides. Thus, it can be analyzed using even-/odd-mode analysis, wherein the filter is driven with two canonical test inputs. The first input, called the even-mode, comprises identical input signals at both ports in-phase. The second input, called the odd-mode, comprises identical signals at both ports 180 degrees out-of-phase. The response of the filter to these two inputs may be simulated using single-port equivalents known as the even-mode equivalent circuit and odd-mode equivalent circuit, respectively. The filter is reflectionless (having no reflection at any frequency from either port) because the normalized input impedance of the even-mode equivalent circuit is equal to the normalized input admittance of the odd-mode equivalent circuit, and the normalized input impedance of the odd-mode equivalent circuit is equal to the normalized input admittance of the even-mode equivalent circuit.

In a preferred embodiment, the reactive elements (inductors, capacitors, and transformers) are substantially lossless. Other elements (the resistors) are substantially lossy. In some preferred embodiments, the substantially lossy elements take the form of impedance-matched internal subnetworks. In some embodiments, the substantially lossy elements have equivalent resistance equal to the characteristic impedance, while in other embodiments they do not.

The embodiment in FIG. 7B further has two critical subcircuits involving transformers and other passive elements, encircled by dashed lines. These critical subcircuits equate in their behavior to tee- and pi-networks of lumped elements wherein at least one of the elements is negatively valued, as shown in FIG. 2.

Figure 8:
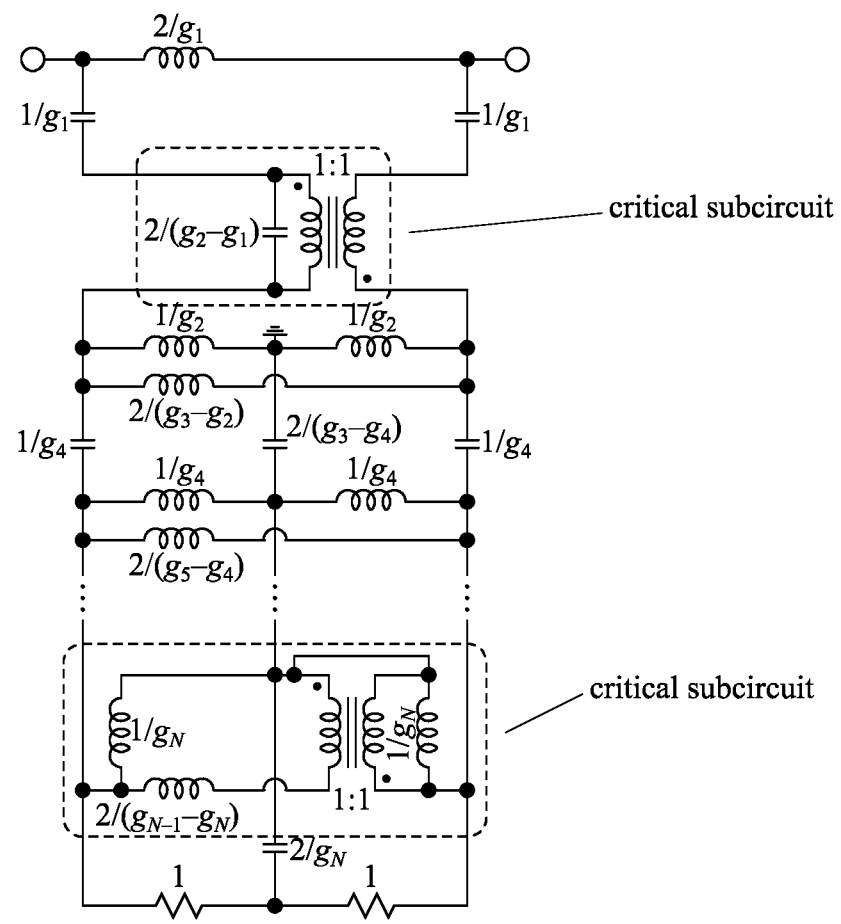
FIG. 8 Shows an example of a reflectionless filter in the present invention wherein three redundant transformers of a critical subcircuit have been replaced with one. Critical subcircuits are encircled with dashed lines.
Figure 9:
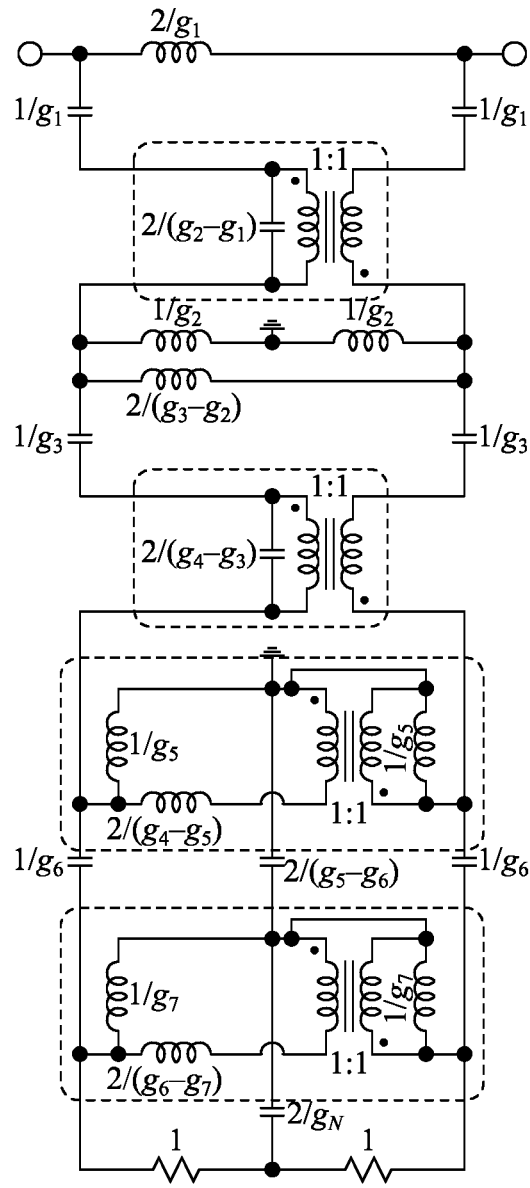
FIG. 9 shows an example of a seventh-order reflectionless filter using four critical subcircuits (encircled with dashed lines) to realize a low-pass Butterworth response.

In some preferred embodiments, such as those shown in FIGS. 7A and 7B, one or more of the critical subcircuits may be coupled to the remainder of the filter with additional coupling transformers, as indicated in the figures. Further, in some embodiments, such as that shown in FIG. 7A these coupling transformers are oriented such that DC current is passed to the remainder of the filter in the stop-band, while in other preferred embodiments, such as that shown in FIG. 7B, the coupling transformers are oriented so as to block DC currents from the remainder of the filter in the stop-band. In still other preferred embodiments, the critical subcircuit comprises a single transformer, as shown in FIG. 8.

In some embodiments, the transformers in the critical subcircuits or those that couple them to the remainder of the circuit have unity turns ratio. In other embodiments, the transformers may have turns ratios other than unity. In some preferred embodiments, the parasitics of a real transformer or coupled coils may be absorbed by the adjacent elements in the filter.

In some preferred embodiments, one or more critical subcircuits may comprise a transformer which is wired to reverse the direction of current flow in one coil with respect to the other. Also in some embodiments, the current-reversing transformer is combined with a lumped element or compound immittance in series, and equates to a pi-network of lumped-elements or immittances of the same type where the central immittance is negatively valued, as illustrated for a series inductor in FIG. 2. In some embodiments, the current-reversing transformer is combined with a parallel lumped element or compound immittance, and equates to a tee-network of immittances of the same type where the central immittance is negative valued, as illustrated for a parallel capacitor in FIG. 2. Other series and parallel immittances may be included to match a prescribed response, as indicated in FIG. 3.

In some preferred embodiments, the element values and critical subcircuits are selected to realize a transmission response that is one of Chebyshev type I, Chebyshev type II (also called inverse Chebyshev), Zolotarev (also called Achieser-Zolotarev) type I or type II (or inverse), Legendre (also called optimal-L), Butterworth (also called maximally flat), Gaussian, or Bessel (also called Bessel-Thomson). In embodiments wherein the response is a Chebyshev type, the critical subcircuits may be selected such that the ripple factor (a free parameter in the Chebyshev response) is less than or equal to 0.1925 for third-order filters, less than or equal to 0.2164 for fifth-order filters, less than or equal to 0.2187 or 0.01891 for seventh-order filters, less than or equal to 0.2192 or 0.02688 for ninth-order filters, less than or equal to 0.2194 or 0.02875 for eleventh-order filters, less than or equal to 0.2194 or 0.2940 for thirteenth-order filters, and less than 0.2195 for filters higher than thirteenth-order.

Figure 10:
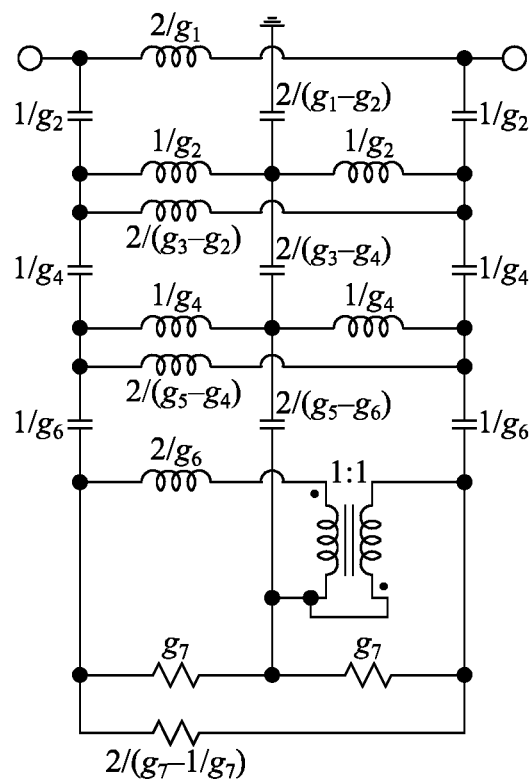
FIG. 10 shows an example of a sixth-order reflectionless filter, illustrating the use of a critical subcircuit to realize an even-order filter, as well as lossy elements (resistors) with normalized values other than unity.

In some embodiments, the transmission response of the filter is low-pass. In other embodiments, it may be high-pass, band-pass, band-stop, or even multi-band. In some embodiments, the filter is odd-order, in others it is even-order, as shown in FIG. 10. Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. The term comprising, where ever used, is intended to include the terms consisting and consisting essentially of. Furthermore, the terms comprising, including, and containing are not intended to be limiting. It is intended that the specification and examples be considered exemplary only with the true scope and spirit of the invention indicated by the following claims.

The invention claimed is:

1. A reflectionless electronic filter comprising:
   an electrically symmetric, two-port circuit, wherein the symmetrical behavior defines an even-mode equivalent circuit and an odd-mode equivalent circuit when the two ports are driven in-phase and 180 degrees out-of-phase, respectively;
   at least one substantially lossless element;
   at least one substantially lossy element or impedance-matched internal subnetwork; and
   at least one critical subcircuit comprising a transformer and one or more lumped-elements;
   wherein the at least one critical subcircuit has only positively valued lumped elements, and has an electrical response equivalent to a tee- or pi-network having at least one lumped-element of a negative value, such that:
   a normalized input impedance of the even-mode equivalent circuit is substantially equal to a normalized input admittance of the odd-mode equivalent circuit; and
   a normalized input admittance of the even-mode equivalent circuit is substantially equal to a normalized input impedance of the odd-mode equivalent circuit.

2. The reflectionless electronic filter of claim 1, wherein the transformer is implemented using coupled coils with a finite coil inductance.

3. The reflectionless electronic filter of claim 1, wherein the transformer has a low coupling factor or other parasitics which are absorbed by adjacent filter elements of the reflectionless electronic filter.

4. The reflectionless electronic filter of claim 1, wherein the at least one critical subcircuit is coupled to the remainder of the filter by additional transformers.

5. The reflectionless electronic filter of claim 4, wherein one of the additional transformers that couple the at least one critical subcircuit to the remainder of the filter is oriented to either to pass DC current in a stop-band of the reflectoinless electronic filter or the block the DC current in the stop-band.

6. The reflectionless electronic filter of claim 1, wherein the transformer has a turns ratio that is one of unity and not unity.

7. The reflectionless electronic filter of claim 1, wherein the transformer is wired in a current-polarity reversing orientation.

8. The reflectionless electronic filter of claim 1, wherein the at least one critical subcircuit comprises the transformer combined with a lumped-element or compound immittance in series, and equates to a pi-network of immittances of a same type where a central immittance thereof is negatively valued.

9. The reflectionless electronic filter of claim 1, wherein at least one critical subcircuit comprises the transformer combined with a lumped element or compound immittance in parallel, and equates to a tee-network of immittances of a same type where a central immittance thereof is negatively valued.

10. The reflectionless electronic filter of claim 1, wherein a transmission response of the filter is one of Chebyshev type I, Chebyshev type II, Zolotarev type I, Zolotarev type II, Legendre, Butterworth, Gaussian, or Bessel.

11. The reflectionless electronic filter of claim 10, wherein the response is a Chebyshev type, and has a ripple factor less than or equal to 0.1925 when the filter is third-order, less than or equal to 0.2164 when the filter is fifth-order, less than or equal to 0.2187 when the filter is seventh-order, less than or equal to 0.2192 when the filter is ninth-order, less than or equal to 0.2194 when the filter is eleventh and thirteenth-order, and less than or equal to 0.2195 when the filter is higher than thirteenth-order.

12. The reflectionless electronic filter of claim 10, wherein the response is a Chebyshev type, and has a ripple factor less than or equal to 0.01891 when the filter is seventh-order, less than or equal to 0.02688 when the filter is ninth-order, less than or equal to 0.02875 when the filter is eleventh-order, less than or equal to 0.02940 when the filter is thirteenth-order, less than or equal to 0.02967 when the filter is fifteenth-order, and less than or equal to 0.2980 when the filter is higher than fifteenth-order.

13. The reflectionless electronic filter of claim 1, wherein a transmission response of the reflectionless electronic filter is one of low-pass, high-pass, band-pass, band-stop, and multi-band.

14. The reflectionless electronic filter of claim 1, wherein an order of the filter is one of even or odd.

15. The reflectionless electronic filter of claim 1, wherein the at least one substantially lossy element or impedance-matched internal subnetwork has an equivalent normalized impedance of one of unity and not unity.

* * * * *